United States Patent
Maejima

(10) Patent No.: US 8,369,130 B2
(45) Date of Patent: Feb. 5, 2013

(54) NONVOLATILE SEMICONDUCTOR MEMORY DEVICE

(75) Inventor: Hiroshi Maejima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 12/885,896

(22) Filed: Sep. 20, 2010

(65) Prior Publication Data

US 2011/0116300 A1    May 19, 2011

(30) Foreign Application Priority Data

Nov. 18, 2009   (JP) ................................. 2009-262821

(51) Int. Cl.
*G11C 11/21* (2006.01)
(52) U.S. Cl. ..................................... 365/148
(58) Field of Classification Search .................. None
See application file for complete search history.

(56) References Cited

U.S. PATENT DOCUMENTS

| 7,433,222 | B2 * | 10/2008 | Hosoi et al. ................. 365/148 |
| 7,911,854 | B2 | 3/2011 | Nagashima et al. | |
| 2007/0014157 | A1 * | 1/2007 | Hung et al. .............. 365/185.18 |
| 2008/0025078 | A1 * | 1/2008 | Scheuerlein et al. ......... 365/163 |
| 2009/0244953 | A1 | 10/2009 | Maejima | |

FOREIGN PATENT DOCUMENTS

| JP | 2009-217908 | 9/2009 |
| KR | 10-2008-0083210 | 9/2008 |

OTHER PUBLICATIONS

Office Action issued Feb. 21, 2012, in Korean Patent Application No. 10-2010-0084151 (with English-language translation).

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

A nonvolatile semiconductor memory device according to an embodiment comprises a memory cell array including plural mutually crossing first and second lines and memory cells arranged at intersections of the first and second lines, each memory cell containing a variable resistance element and a rectifier element connected in series; and a data write/erase circuit operative to apply a voltage required for data write/erase to the memory cell via the first and second lines. The data write/erase circuit includes a first current limit circuit operative to limit the current flowing in the cathode-side line provided on the cathode side of the rectifier element, of the first and second lines, at the time of data write/erase.

16 Claims, 14 Drawing Sheets

MAIN Row decoder

Row Driver

WDRV Driver

WL Current Limiter

VWR Generator

VUX Generator

Column decoder y=<127:0>

Column Driver

Sense Amp/Write Buffer

BL Current Limiter

VUB Generator

BL Current Limiter

NONVOLATILE SEMICONDUCTOR MEMORY DEVICE

CROSS-REFERENCE TO RELATED APPLICATION

This application is based upon and claims the benefit of priority from the prior Japanese Patent Application No. 2009-262821, filed on Nov. 18, 2009, the entire contents of which are incorporated herein by reference.

FIELD

The embodiment relates to a nonvolatile semiconductor memory device.

BACKGROUND

Description of the Related Art

In recent years, as a nonvolatile semiconductor memory device, a ReRAM and a PRAM operable to nonvolatilely store the resistance information of an electrically erasable programmable, variable resistance element have received attention as a successor memory to the flash memory.

The variable resistance element as a storage element in the ReRAM is configured in an electrode/metal oxide (binary or ternary)/electrode form. The variable resistance element has been known to have two types of operating modes. One is of the type that varies the polarity of the applied voltage to switch between the high-resistance state and the low-resistance state. This is referred to as the bipolar type. Another is of the type that does not vary the polarity of the applied voltage but controls the voltage value and the applied time to switch between the high-resistance state and the low-resistance state. This is referred to as the unipolar type.

Realization of a high-density memory cell array prefers the unipolar type. This is because the unipolar type makes it possible to superimpose a variable resistance element and a rectifier element such as a diode on each cross point of a bit line and a word line, thereby configuring a cell array layer of the minimum 1-cell size, $4F^2$, without using transistors. Such cell array layers can be stacked to increase the memory capacity without increasing the area of the cell array. This is the purpose of the three-dimensional stacked variable resistance memory.

In the case of the unipolar-type ReRAM, writing data into the variable resistance memory can be performed with application of a program voltage of, for example, around 4.0 V to the variable resistance element to supply a current flow of around several 100 nA to several 10 nA for several 10 ns to 1 μs. As a result, the variable resistance element changes from the high-resistance state to the low-resistance state. This state change is referred to as "program" or "set". When an erase voltage of around 3.0 V is applied to the data-programmed variable resistance element to supply a current flow of 1-10 μA for several μs, the variable resistance element changes the low-resistance state to the high-resistance state. This state change is referred to as "erase" or "reset".

In setting for changing the high-resistance memory cell to the low-resistance state, an excessively longer application of the applied pulse causes a problem because the memory cell once changed into the low-resistance state is reset again to the high-resistance state due to production of Joule heat. In resetting for changing the low-resistance memory cell to the high-resistance state, when the memory cell changes to the high-resistance state, the voltage regulator operative to generate the voltage of the applied pulse cannot follow this speed. Thus, the supply of charge becomes excessive, and the voltage of the applied pulse becomes higher. In this case, the controllability becomes worse, and the memory cell returns again to the set state in the worst case as a problem.

With respect to this problem, there has been proposed a method of limiting the current flowing in the line connected to the anode-side of the diode. In this case, the current flowing in the selected memory cell is also limited and accordingly it is made possible to prevent failed write from occurring.

In the case of this method, however, it is not possible to control the discharge of the charge corresponding to the parasitic capacity on the line connected to the anode-side. As a result, the charge accumulated in the parasitic capacity leaks to the memory cell and causes a problem because the current limiting effect becomes limited.

DETAILED DESCRIPTION

A nonvolatile semiconductor memory device according to an embodiment comprises a memory cell array including plural mutually crossing first and second lines and memory cells arranged at intersections of the first and second lines, each memory cell containing a variable resistance element and a rectifier element connected in series; and a data write/erase circuit operative to apply a voltage required for data write/erase to the memory cell via the first and second lines. The data write/erase circuit includes a first current limit circuit operative to limit the current flowing in the cathode-side line provided on the cathode side of the rectifier element, of the first and second lines, at the time of data write/erase.

The nonvolatile semiconductor memory device according to the embodiment is described below in detail with reference to the drawings.

First Embodiment

Figure 1:
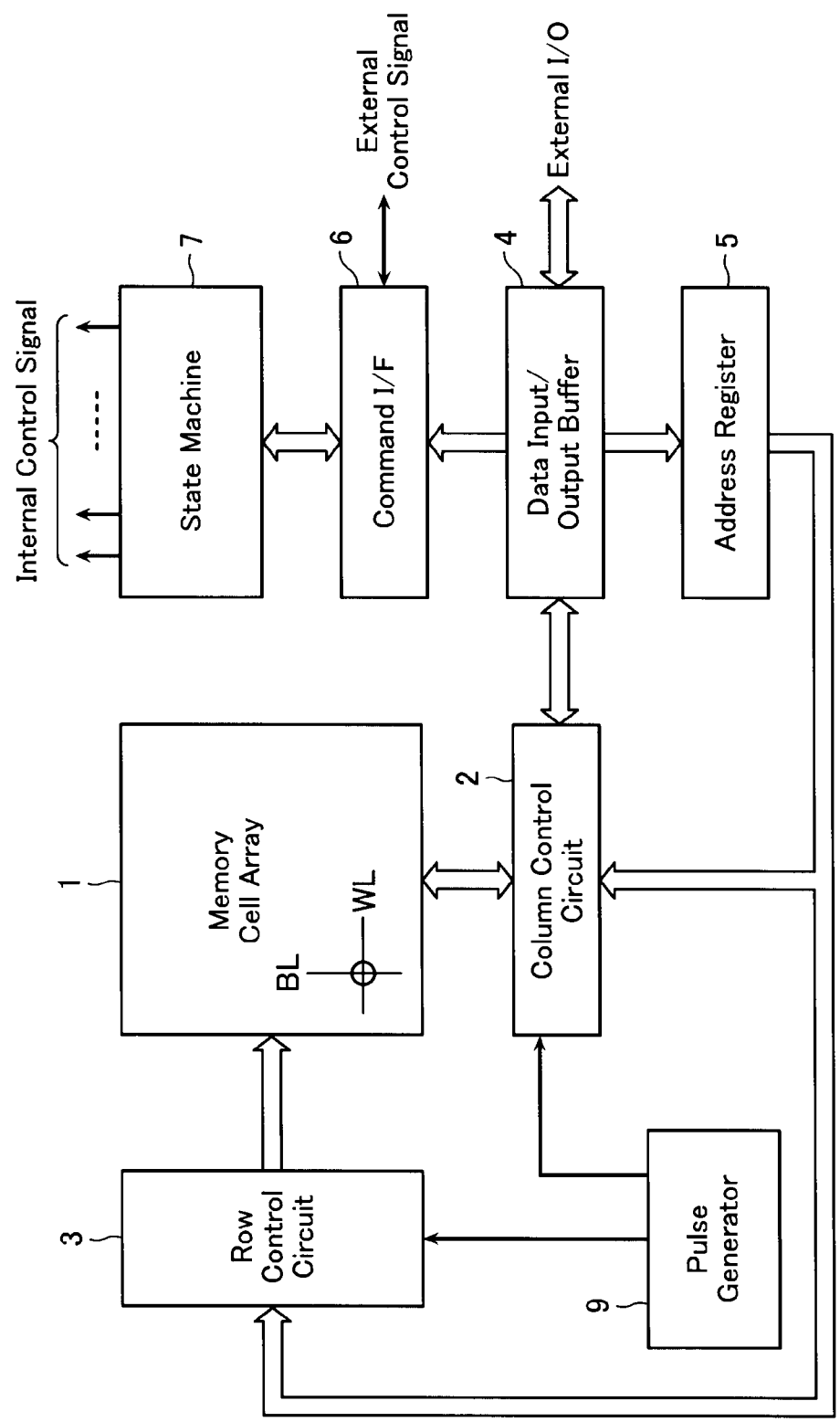
FIG. 1 is a block diagram of a nonvolatile memory according to an embodiment.

FIG. 1 is a block diagram of a nonvolatile memory according to a first embodiment.

The nonvolatile memory comprises a memory cell array 1 of memory cells arranged in matrix, each memory cell including a later-described variable resistance element, as in a PCRAM (Phase Change RAM) and a ReRAM (Resistance RAM). A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A row control circuit 3 is provided on a position adjacent to the memory cell array 1 in the word line WL direction. It selects the word line WL in the memory cell array 1 and applies voltages required to erase data from the memory cell, write data in the memory cell, and read data out of the memory cell. The column control circuit 2 and the row control circuit 3 configure a data write/erase circuit.

A data input/output buffer 4 is connected to an external host device, not shown, to receive write data, receive erase instructions, provide read data, and receive address data and command data from/to the host device. The data input/output buffer 4 sends received write data to the column control circuit 2 and receives read-out data from the column control circuit 2 and provides it to external. An address fed from the external host device to the data input/output buffer 4 is sent via an address register 5 to the column control circuit 2 and the row control circuit 3. A command fed from the external host device to the data input/output buffer 4 is sent to a command interface 6. The command interface 6 receives an external control signal from external and decides whether the data fed to the data input/output buffer 4 is write data, a command or an address. If it is a command, then the command interface transfers it as a received command signal to a state machine 7. The state machine 7 manages the entire nonvolatile memory and receives commands from the external host device to perform reading, writing, erasing, managing the input/output of data, and so forth. The external host device can also receive status information managed by the state machine 7 and decide the operation result. The status information is also utilized in control of write and erase.

The state machine 7 controls the pulse generator 9. Under this control, the pulse generator 9 is allowed to provide a pulse of any voltage at any timing. The pulse formed herein can be transferred to any line selected by the column control circuit 2 and the row control circuit 3.

Peripheral circuit elements other than the memory cell array 1 can be formed in the silicon substrate immediately beneath the memory array 1 formed in a wiring layer. Thus, the chip area of the nonvolatile memory can be made almost equal to the area of the memory cell array 1.

Figure 2:
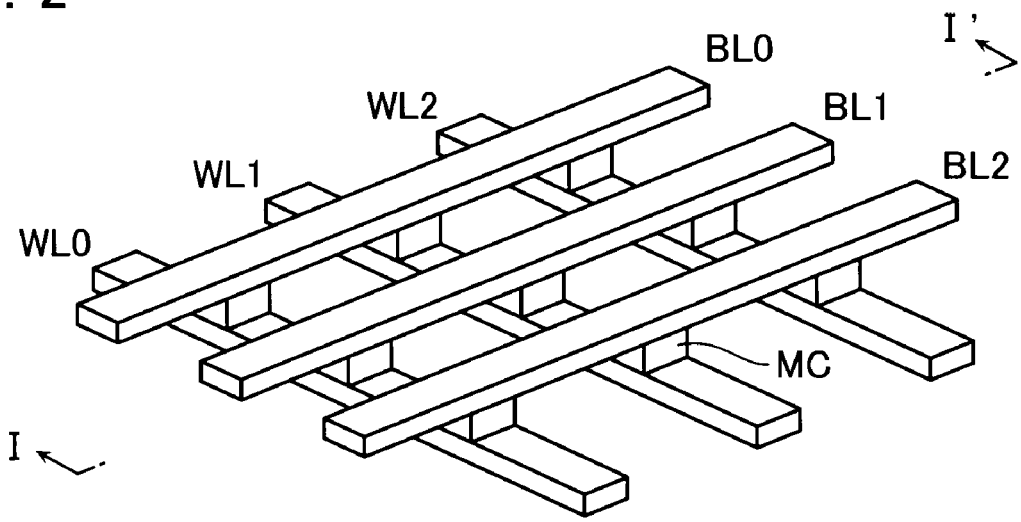
FIG. 2 is a perspective view of part of a memory cell array in the nonvolatile memory according to the same embodiment.
Figure 3:
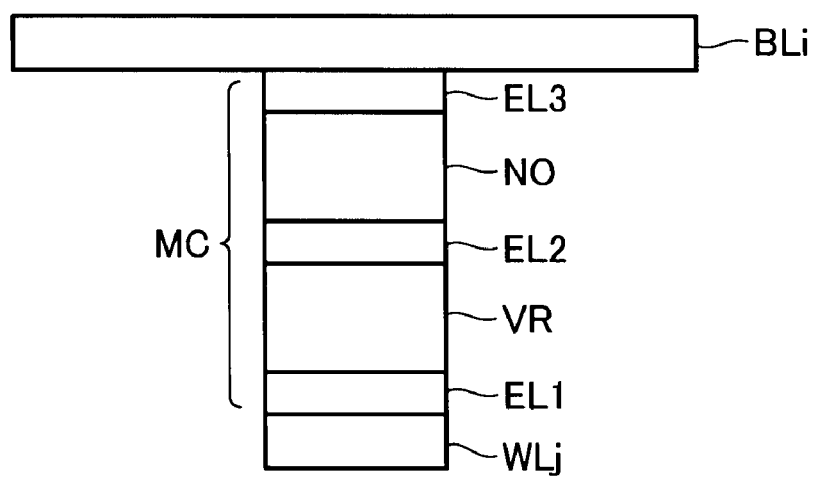
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural word lines WL0-WL2 (first lines, or the cathode-side lines) disposed in parallel, which cross plural bit lines BL0-BL2 (second lines, or the anode-side lines) disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serially-connected circuit of a variable resistance element VR and a non-ohmic element NO as shown in FIG. 3.

The variable resistance element VR can vary the resistance through current, heat, or chemical energy on voltage application. Arranged on an upper and a lower surface thereof are electrodes EL1, EL2 serving as a barrier metal and an adhesive layer. Material of the electrodes may include Pt, Au, Ag, TiAlN, SrRuO, Ru, RuN, Ir, Co, Ti, TiN, TaN, LaNiO, Al, PtIrO$_x$, PtRhO$_x$, Rh/TaAlN. A metal film capable of achieving uniform orientation may also be interposed. A buffer layer, a barrier metal layer and an adhesive layer may further be interposed.

Available examples of the variable resistance element VR include: one that changes the resistance in accordance with a phase change between the crystalline state and the amorphous state, such as a chalcogenide (PCRAM); one that changes the resistance by precipitating metal cations to form a bridge (contacting bridge) between electrodes and ionizing the precipitated metal to destruct the bridge (CBRAM); and one that changes the resistance by applying a voltage or current (ReRAM) (which is roughly divided into one that causes a variation in resistance in accordance with the presence/absence of charge trapped in charge traps present in the electrode interface, and one that causes a variation in resistance in accordance with the presence/absence of the conduction path due to an oxygen loss and so forth).

Figure 4:
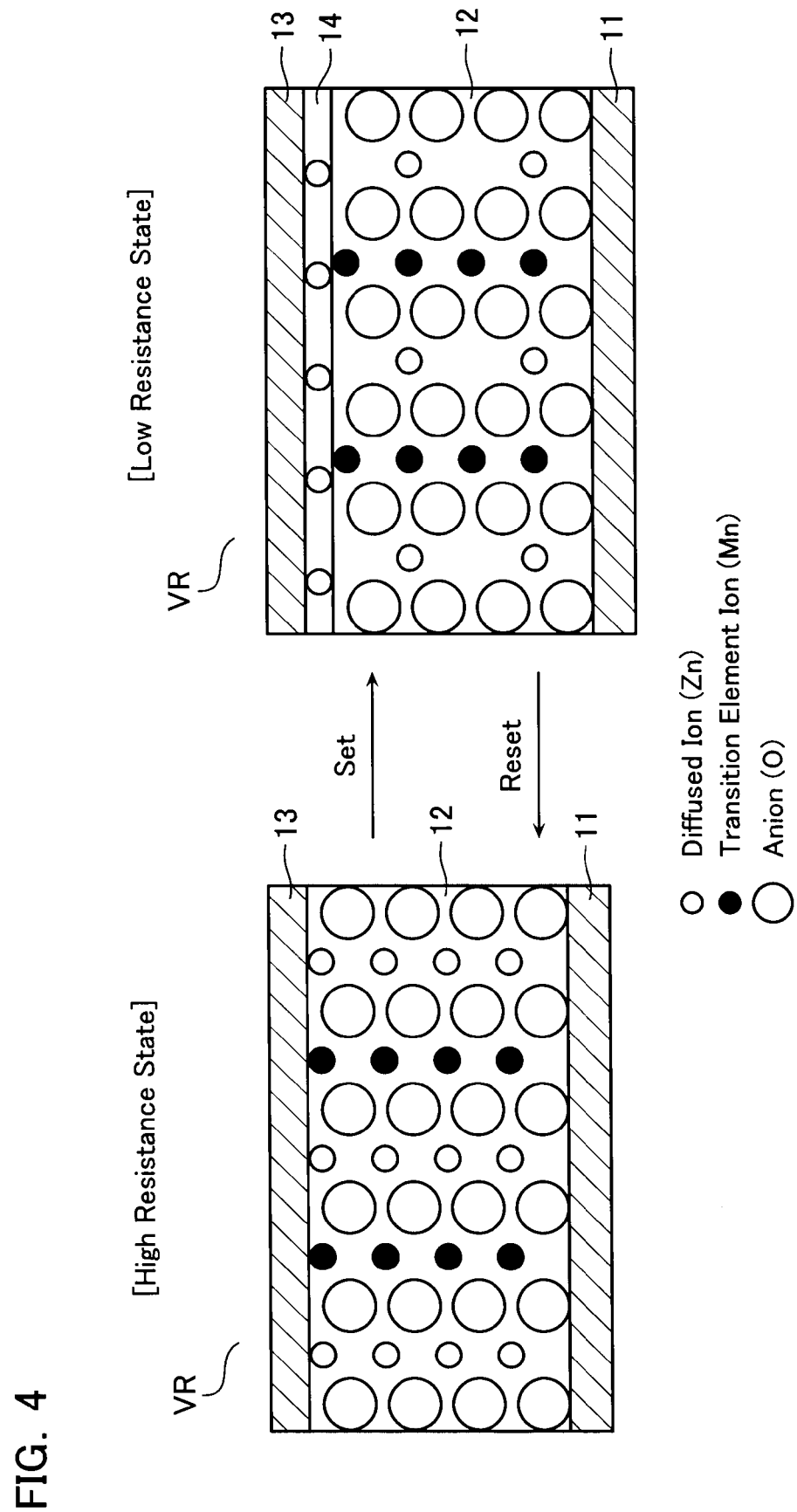
FIG. 4 is a schematic cross-sectional view showing an example of a variable resistance element in the same embodiment.

FIGS. 4 and 5 show examples of the ReRAM. The variable resistance element VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A is Zn, M is Mn, and X is O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for sufficient time, which causes Joule heating to facilitate the oxidation reduction reaction in the recording layer 12. Application of an electric field in the opposite direction from that at the time of setting may also allow resetting. Hereinafter, the voltage required for setting and the voltage required for resetting are referred to as the "write voltage".

Figure 5A:
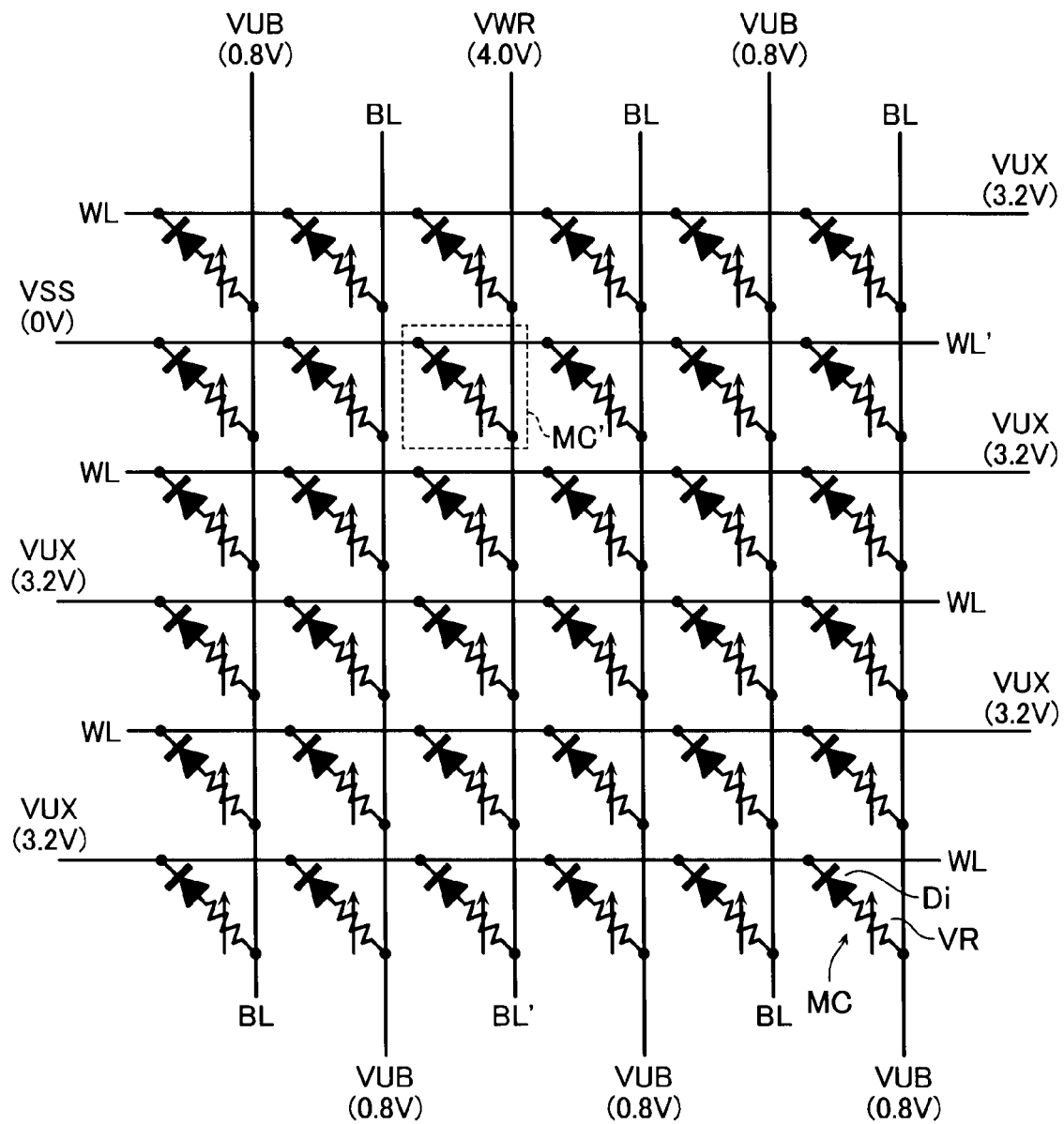
FIG. 5A is a diagram showing a biased state of the memory cell array in the same embodiment.
Figure 5B:
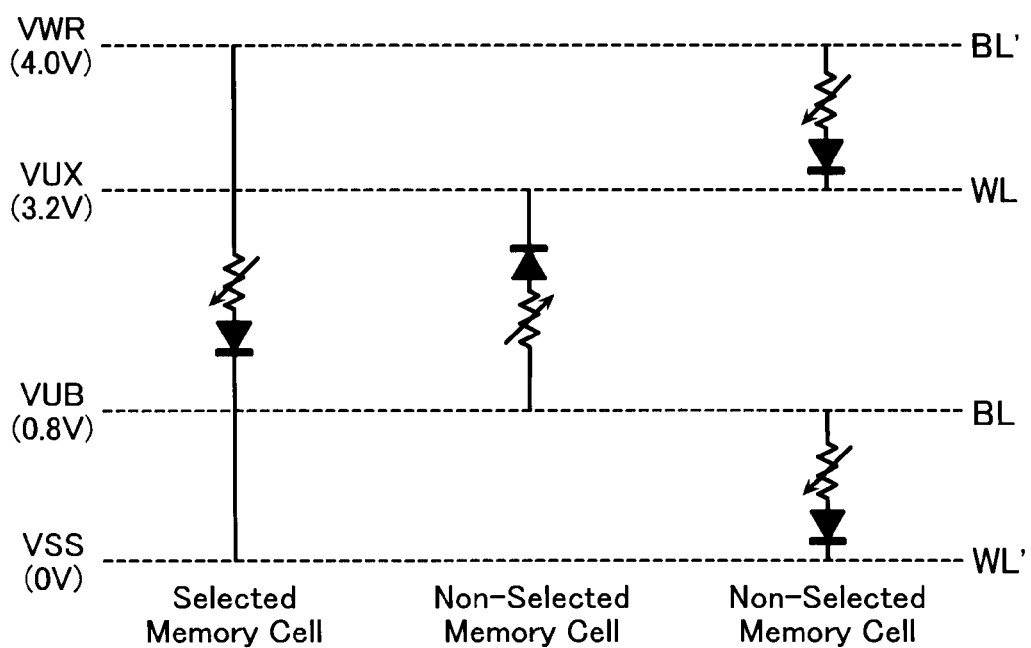
FIG. 5B is a diagram showing a biased state of the memory cell array in the same embodiment.

FIGS. 5A and 5B are diagrams showing biased states of the memory cell array at the time of setting/resetting in the present embodiment. In the case of FIG. 5, the memory cell MC contains a variable resistance element VR and a diode Di connected in series.

The following description is given to the case where a memory cell MC' surrounded by the dotted line in FIG. 5A is set/reset as an example. In this case, the word line WL' and the bit line BL' connected to the selected memory cell MC' are supplied with the ground voltage VSS (for example, a voltage of 0 V: hereinafter also referred to as the "selected word-line voltage") and the write voltage VWR (for example, a voltage of 4.0 V: hereinafter also referred to as the "selected bit-line voltage"), respectively. On the other hand, other non-selected word lines WL and non-selected bit lines BL are supplied with the non-selected word-line voltage VUX (for example, 3.2 V) and the non-selected bit-line voltage VUB (for example, 0.8 V), respectively. As a result, the selected memory cell MC' is biased with "VWR-VSS" in the forward direction of the diode Di as shown in FIG. 5B. Non-selected word lines WL and non-selected bit lines BL are biased with "VUX-VUB" in the reverse direction of the diode Di as shown in FIG. 5B. The memory cells MC located at intersections of the non-selected word lines WL and the selected bit line BL' and the memory cells MC located at intersections of the selected word line WL' and the non-selected bit lines BL (hereinafter referred to as the "half-selected memory cells") are biased with "VWR-VUX" or "VUB-VSS" in the forward direction of the diode Di as shown in FIG. 5B, respectively. The bias placed across the half-selected memory cell is a weak bias of the extent that cannot turn on the diode Di. Namely, the non-selected word-line voltage VUX is set lower than the selected bit-line voltage VWR such that "VWR-VUX" becomes a voltage lower than VF of the diode Di. The non-selected bit-line voltage VUB is set higher than the selected word-line voltage VSS and lower than VF of the diode Di. Application of the voltages to the word lines WL and the bit lines BL in this way places a sufficient forward bias only across the variable resistance element VR in the selected memory cell MC' and consequently makes a transition of the resistance state.

Figure 6:
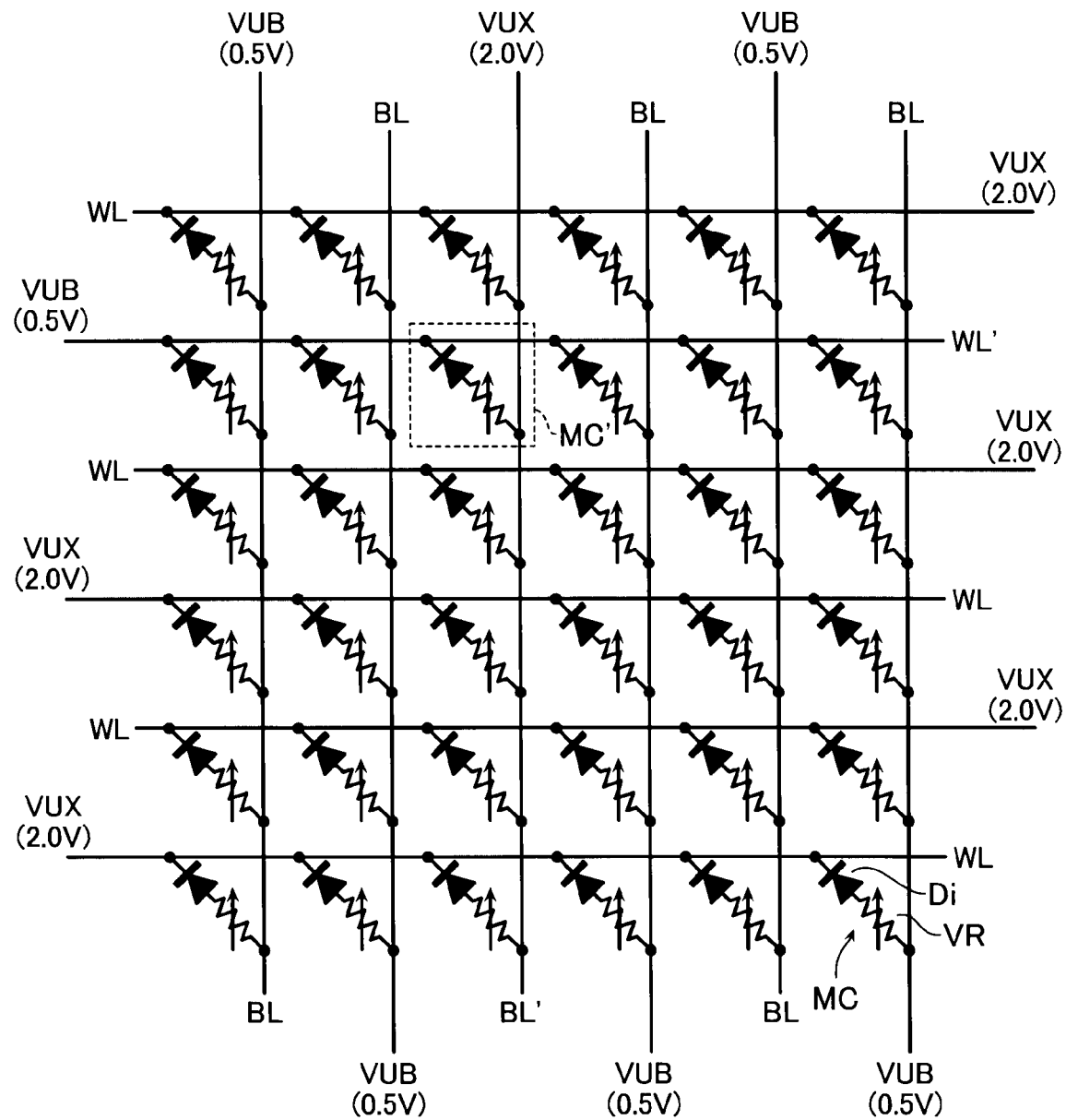
FIG. 6 is a diagram showing a biased state of the memory cell array in the same embodiment.

FIG. 6 is a diagram showing a biased state of the memory cell array at the time of reading in the present embodiment. At the time of reading, the selected bit line BL' is supplied with the same non-selected word-line voltage (for example, 2.0 V) as that on the non-selected word line WL. On the other hand, the selected word line WL' is supplied with the same non-selected bit-line voltage (for example, 0.5 V) as that on the non-selected bit line BL. In this case, the selected memory cell MC' is biased with "VUX-VUB" of the extent that turns on the diode Di and makes no transition of the resistance state of the variable resistance element VR. As a result, the selected bit line BL' is supplied with a flow of current in accordance with the resistance of the variable resistance element VR. This current is sensed and amplified at the sense amp contained in the column control circuit 2 to read out data.

Figure 7:
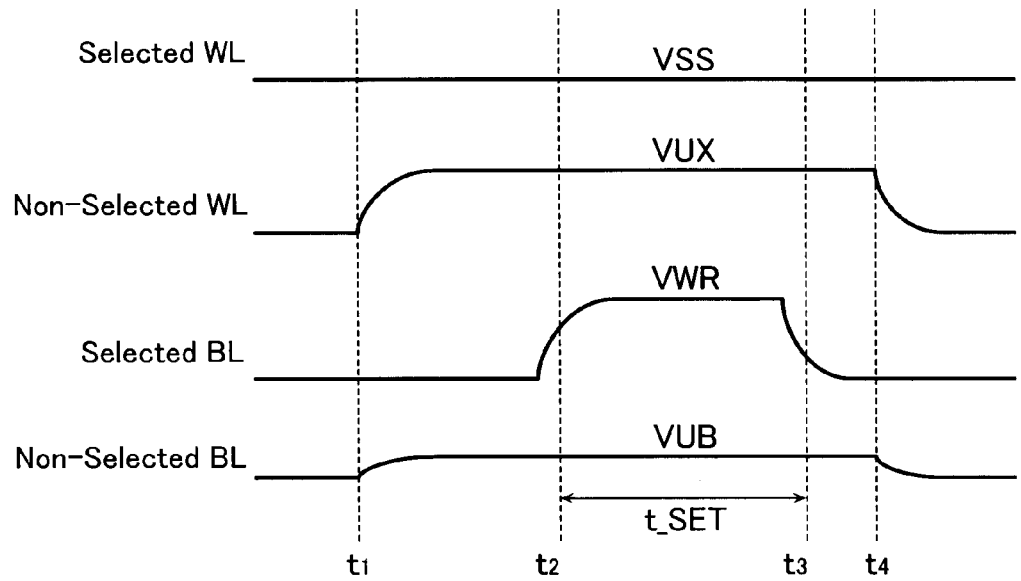
FIG. 7 is a diagram showing an example of operating waveforms at the time of setting the memory cell in the same embodiment.

FIG. 7 is a diagram showing an example of operating waveforms on the word lines WL and the bit lines BL at the time of first setting in the present embodiment. In this operation, the selected word line WL' is kept in the selected state from the beginning and the selected bit line BL' is changed from the non-selected potential to the selected potential to apply a desired voltage to the selected memory cell.

At the time of standby, all word lines WL and bit lines BL are kept at the ground voltage VSS. At the time t1 after the start of setting, the voltages on non-selected word lines WL and non-selected bit lines BL rise and reach the non-selected word-line voltage VUX and the non-selected bit-line voltage VUB, respectively.

Near the subsequent time t2, the voltage on the selected bit line BL rises and, after the time t2, it reaches the selected bit-line voltage VWR.

Near the subsequent time t3, the voltage on the selected bit line BL falls and, after the time t3, it reaches the ground voltage VSS.

Finally, at the time t4, the non-selected word lines WL and non-selected bit lines BL fall and then both reach the ground voltage VSS.

In the case of FIG. 7, during the period t_SET between the time t2 after the rise of the selected bit line BL and the time t3, the selected memory cell MC is forward-biased with "VWR-VSS" required for setting such that the resistance state of the variable resistance element VR makes a transition from the high-resistance state to the low-resistance state.

Figure 8:
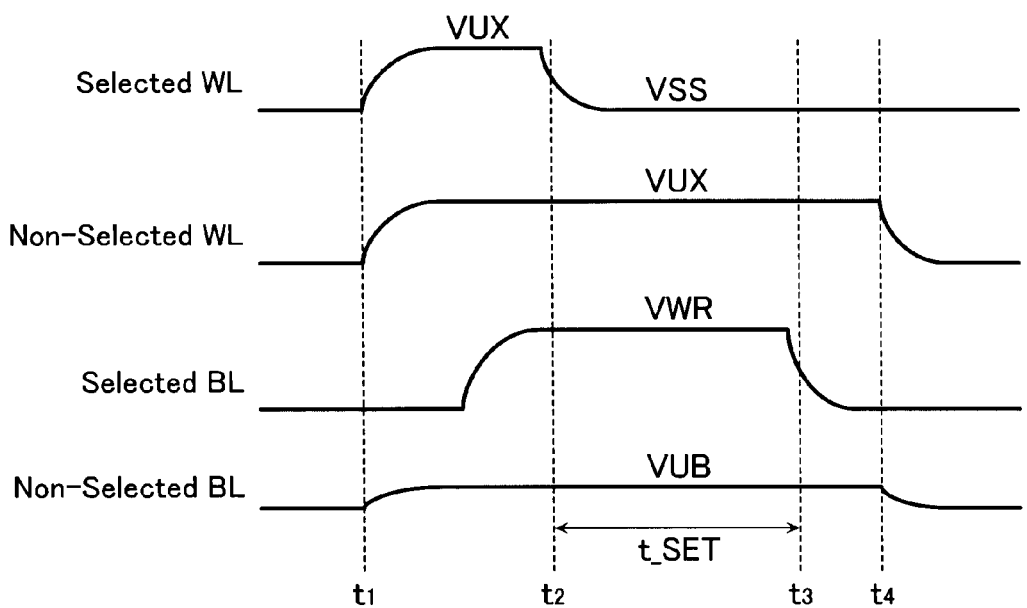
FIG. 8 is a diagram showing another example of operating waveforms at the time of setting the memory cell in the same embodiment.

FIG. 8 is a diagram showing another example of operating waveforms on the word lines WL and the bit lines BL at the time of second setting in the present embodiment. In this operation, the selected bit line BL' is kept in the selected state from the beginning and the selected word line WL' is changed from the non-selected potential to the selected potential to apply a desired voltage to the selected memory cell.

At the time of standby, all word lines WL and bit lines BL are kept at the ground voltage VSS. At the time t1 after the start of setting, the voltages on the selected/non-selected word lines WL and the non-selected bit lines BL rise and reach the non-selected word-line voltage VUX and the non-selected bit-line voltage VUB, respectively. Thereafter, the voltage on the selected bit line BL rises and reaches the selected bit-line voltage VWR.

After the voltage on the selected bit line BL reaches the selected bit-line voltage VWR, the voltage on the selected word line WL falls and, after the time t2, it reaches the selected word-line voltage VSS.

Near the subsequent time t3, the voltage on the selected bit line BL falls and, after the time t3, it reaches the ground voltage VSS.

Finally, at the time t4, the non-selected word lines WL and non-selected bit lines BL fall and then both reach the ground voltage VSS.

In the case of FIG. 8, during the period t_SET between the time t2 after the fall of the selected word line WL and the time t3, the selected memory cell MC is forward-biased with "VWR-VSS" required for setting such that the resistance state of the variable resistance element VR makes a transition from the high-resistance state to the low-resistance state.

In either of the cases shown in FIGS. 7 and 8, the selected memory cell MC is continuously biased with "VWR-VSS" during the period t_SET even after the resistance state of the variable resistance element VR makes the transition to the low-resistance state. In this case, the selected memory cell MC supplied with a flow of reset current produces Joule heat, which may possibly cause failed reset in which the selected memory cell MC is reset again to make a transition to the high-resistance state.

Figure 9:
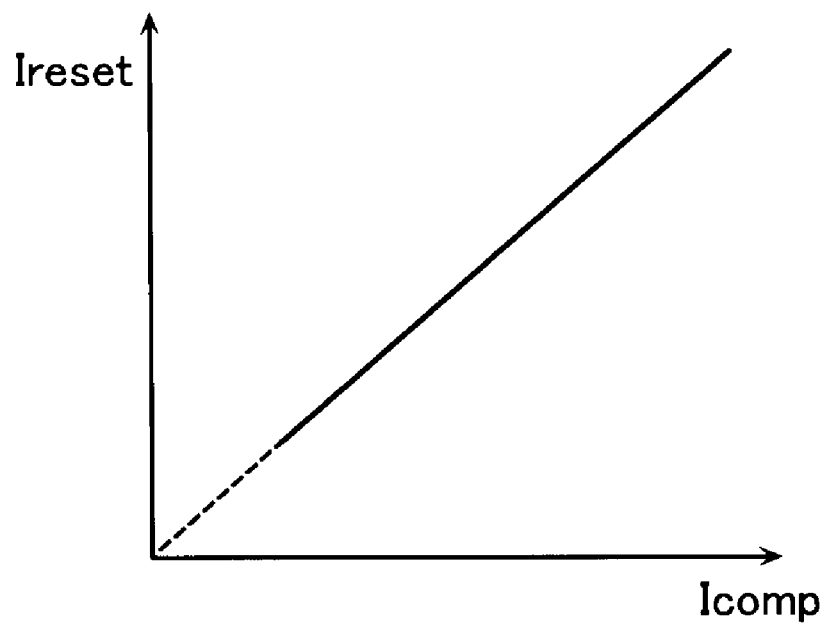
FIG. 9 is a diagram showing a relation between the current limiting value and the reset voltage at the time of setting in the same embodiment.

If the current flowing in the selected memory cell at the time of setting can be limited, the reset current also decreases. In a word, the value of the current, Icomp, flowing in the selected memory cell at the time of setting and the reset current, Ireset, flowing after the selected memory cell turns to the set state are known to have a proportional relation therebetween as can be found from FIG. 9. Then, the present embodiment uses the circuitry shown in FIGS. 10-20 to reduce the reset current Ireset.

The following circuitry is described on an example of a 1-Mbit memory cell array 1, which includes memory cells MC of 2 Kbits (=2048 bits) arrayed in the word line WL direction by 512 bits in the bit line BL direction.

Figure 10:
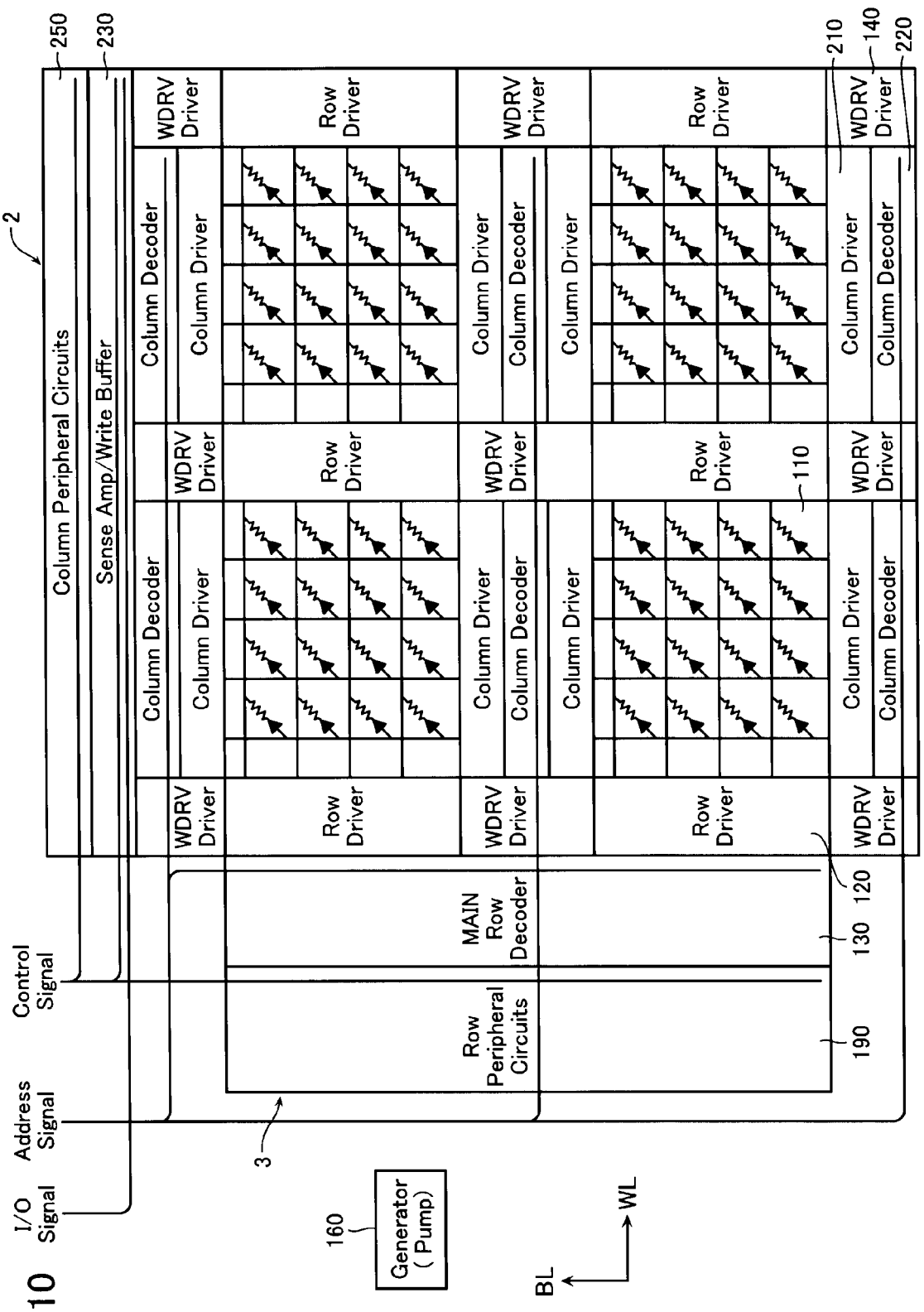
FIG. 10 is a block diagram of the periphery of the memory cell array in the nonvolatile memory according to the same embodiment.

FIG. 10 is a block diagram of the memory cell array 1 and peripheral circuits thereof in the nonvolatile memory according to the present embodiment.

As shown in FIG. 10, the row control circuit 3 includes, for example, a row driver 120, a main row decoder 130, a write-drive-line driver 140, and a row-system peripheral circuit 190. On the other hand, the column control circuit 2 includes, for example, a column driver 210, a column decoder 220, a sense amp/write buffer 230, and a column-system peripheral circuit 250.

The word lines WL according to the present embodiment have a hierarchical structure. The main row decoder 130 selectively drives any one of 256 pairs of main word lines MWLx, MWLbx (x=<255:0>). These main word lines MWLx, MWLbx are turned to "H", "L" when selected and "L", "H" when not selected. A pair of main word lines MWLx, MWLbx is connected to the row driver 120. The row driver 120 selectively drives one of 8 word lines WLx<7:0> located under the hierarchy of the main word lines MWLx, MWLbx. Namely, the row driver 120 connected to the main word lines MWLx, MWLbx selectively driven by the main row decoder 130 further selectively drives the word line WL, thereby selectively driving one word line WL. The write-drive-line driver 140 is connected to 8 write drive lines WDRV<7:0> and the supply line of the non-selected word-line voltage VUX. The write drive lines WDRV<7:0> and the supply line of the non-selected word-line voltage VUX are connected to the row driver 120 and applied to the word line WL through the row driver 120. Specifically, at the time of setting, of the 8 write drive lines WDRV<7:0>, one write drive line WDRV corresponding to the selected word line WL is supplied with the selected word-line voltage VSS and other 7 lines with the non-selected word-line voltage VUX. The row-system peripheral circuit 190 is arranged to manage the entire of the nonvolatile memory and perform receiving the control signal from the external host device, reading, writing, erasing, managing the input/output of data, and so forth.

The bit lines according to the present embodiment have a hierarchical structure as well. The column decoder 220 selectively drives any one of 128 pairs of column selection lines CSLy, CSLby (y=<128:0>). As an example, in the selected column selection lines CSLy, CSLby, the column selection line CSLy turns to the "H" state, and the column selection line CSLby to the "L" state. In contrast, in non-selected column selection lines CSLy, CSLby, the column selection line CSLy turns to the "L" state and the column selection line CSLby to the "H" state. A pair of column selection lines CSLy, CSLby is connected to the column driver 210. The column driver 210 selectively drives one of 8 bit lines BLy<7:0> located under the hierarchy of the column selection lines CSLy, CSLby. Namely, the column driver 210 connected to the column selection lines CSLy, CSLby selectively driven by the column decoder 220 further selectively drives the bit line BL, thereby selectively driving one bit line BL. The sense amp/write buffer 230 senses and amplifies the signal read out on a local data line LDQ<7:0> and feeds the write data fed from a data input/output line I/O<7:0> to the memory cell MC via the column driver 210. The sense amp/write buffer 230 is connected to 8 local data lines LDQ<7:0> and the supply line of the column power VWE. The local data lines LDQ<7:0> and the supply line of the selected bit-line voltage VWR are connected to the column driver 210. Specifically, at the time of setting, of the 8 local data lines LDQ<7:0>, one local data line LDQ<7:0> corresponding to the selected bit line BL is supplied with the selected bit-line voltage VWR, and other 7 lines with the non-selected bit-line voltage VUB. The column-system peripheral circuit 2 is arranged to manage the entire of the nonvolatile memory and perform receiving the control signal from the external host device, reading, writing, erasing, managing the input/output of data, and so forth.

Referring next to FIGS. 11-15, the configuration of the row control circuit 3 is described in detail. FIGS. 11-15 are circuit diagrams showing a configurative example of the row control circuit 3 in the nonvolatile memory.

Figure 11:
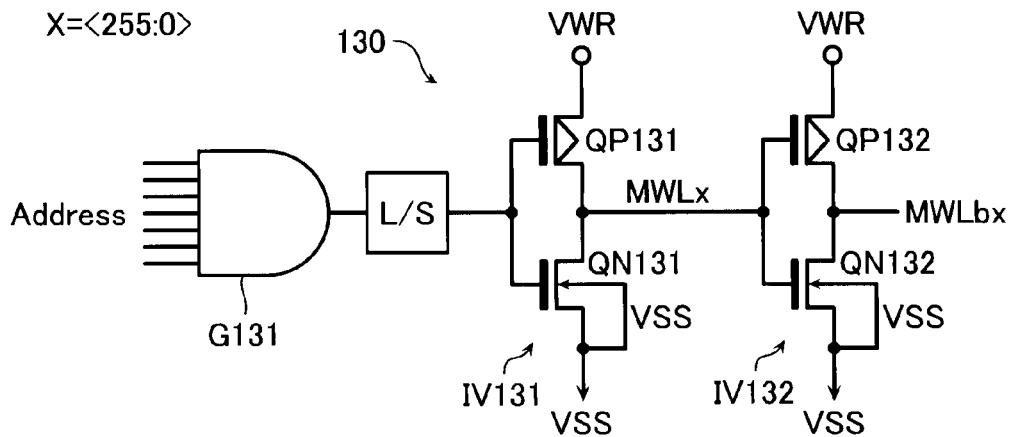
FIG. 11 is a circuit diagram of a main row decoder in the nonvolatile memory according to the same embodiment.
Figure 12:
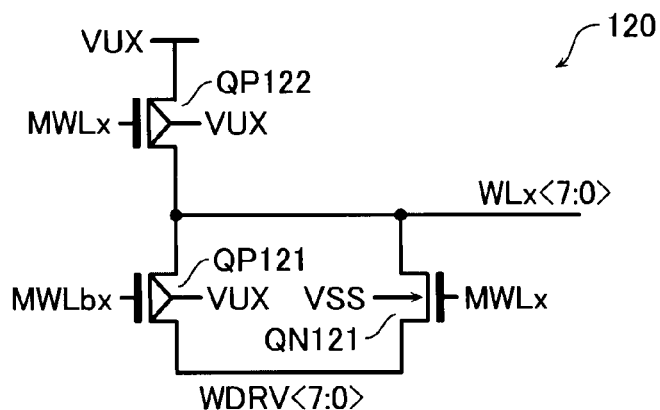
FIG. 12 is a circuit diagram of a row driver in the nonvolatile memory according to the same embodiment.

FIG. 11 is a circuit diagram of the main row decoder 130. The main row decoder 130 is a pre-decoder, which receives the row address and selects one of 256 pairs of main word lines MWLx and MWLbx (x=<255:0>). The main row decoder 130 includes such the circuit as shown in FIG. 12 for each of the 256 pairs of main word lines MWLx, MWLbx. As shown in FIG. 11, in one main row decoder 130, the address signal lines connected to the main row decoder 130 are connected to a logical gate G131. The output signal from the logical gate G131 is fed via a level shifter L/S to the input terminal of an inverter IV131 composed of a PMOS transistor QP131 and an NMOS transistor QN131. The source of the transistor QP131 is supplied with the write voltage VWR, and the source of the transistor QN131 is grounded. The output terminal of the inverter IV131 is connected to the main word line MWLx and also connected to the input terminal of the next-stage CMOS inverter IV132 composed of a PMOS transistor QP132 and an NMOS transistor QN132. The source of the transistor QP132 is supplied with the write voltage VWR as well, and the source of the transistor QN132 is grounded. The output terminal of the inverter IV132 is connected to the main word line MWLbx. The main word lines MWLx, MWLbx are connected to the input terminals of the row driver 120.

FIG. 12 is a circuit diagram of the row driver 120. The row driver 120 is connected to any one of 256 pairs of main word lines MWLx and MWLbx (x=<255:0>) as the input and also connected to the write drive line WDRV<7:0> extending from the WDRV driver 140 to determine the output of the word line WLx<7:0>. The word line WLx<7:0> is connected to plural memory cells MC arranged in line. Such row drivers 120 are provided 8 for one main row decoder 130. The word lines WLx<7:0> are composed of 8 lines including the word lines WLx<0>-WLx<7>. Similarly, the write drive lines WDRV<7:0> are composed of 8 lines WDRV<0>-WDRV<7>. As shown in FIG. 12, the row driver 120 includes a transistor pair of two PMOS transistors QP121 and QP122 having mutually connected sources, and an NMOS transistor QN121 having a source and a drain connected to the source and the drain of the transistor QP121 correspondingly. The transistor QP122 has a gate connected to the main word line MWLx and a drain connected to the supply line of the non-selected word-line voltage VUX. The transistors QP121, QN121 have respective gates connected to the main word lines MWLbx, MWLx, and drains connected to any one of the write drive lines WDRV<7:0>. The sources of the transistors QP121, QP122 and the drain of the transistor QN121 are commonly connected to any one of the word lines WLx<7:0>.

Figure 13:
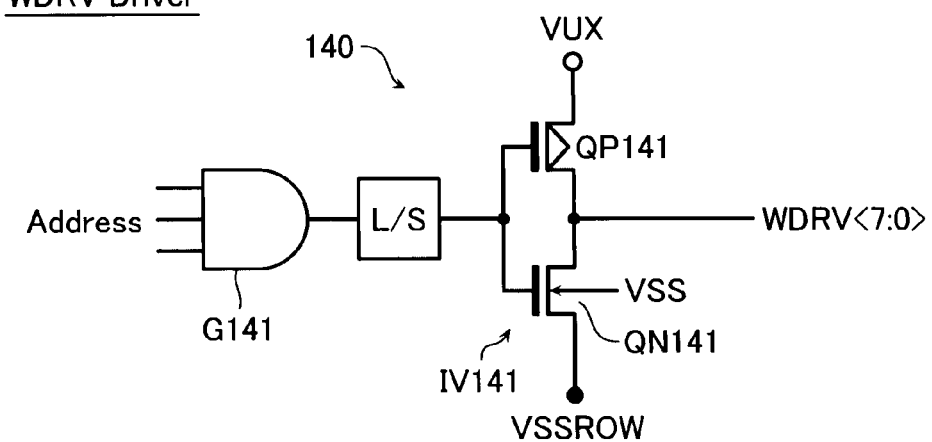
FIG. 13 is a circuit diagram of a write-drive-line driver in the nonvolatile memory according to the same embodiment.

FIG. 13 is a circuit diagram of the write-drive-line driver 140 (WDRV Driver). The write-drive-line driver 140 is connected to the address signal lines (Address). The write-drive-line driver 140 is also a pre-decoder. The address signal lines connected to the write-drive-line driver 140 are connected to a logical gate G141. The output signal from the logical gate G141 is fed via a level shifter L/S to the input terminal of a CMOS inverter IV141 composed of a PMOS transistor QP141 and an NMOS transistor QN141. The source of the transistor QP141 is connected to the supply line supplied with the non-selected word-line voltage VUX, and the source of the transistor QN141 is connected to the supply line of the row ground voltage VSSROW output from the later-described word-line current limit circuit. The drains of the transistors QP141 and QP141 are both connected to the write drive line WDRV<7:0>.

Figure 14:
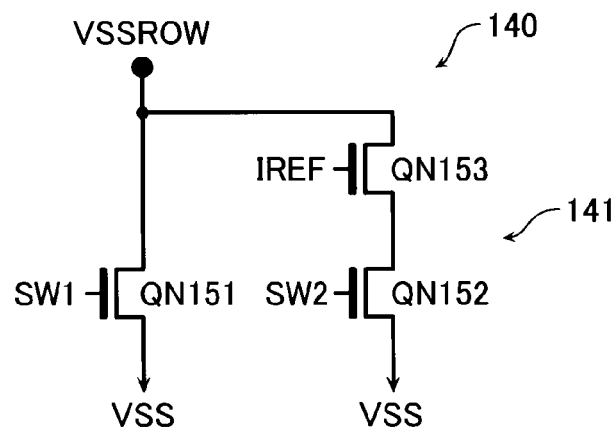
FIG. 14 is a circuit diagram of a word-line current limit circuit in the nonvolatile memory according to the same embodiment.

FIG. 14 is a circuit diagram of a word-line current limit circuit 141, that is, a first current limit circuit contained in the write-drive-line driver 140. The word-line current limit circuit 141 has the input of switch signals SW1 and SW2, that is, the signals for controlling whether the current flowing in the word line WL should be limited or not, and the input of the current reference voltage IREF for adjusting the current limiting value. The word-line current limit circuit 141 includes a first switch circuit, that is, an NMOS transistor QN151 controllable with the switch signal SW1, between the row ground voltage VSSROW and the first voltage or the ground voltage. In parallel with the transistor QN151, there is provided a second switch circuit, that is, a serial circuit of a transistor QN152 controllable with the switch signal SW2 and a current limiting transistor QN153 controllable with the current reference voltage IREF.

Figure 15:
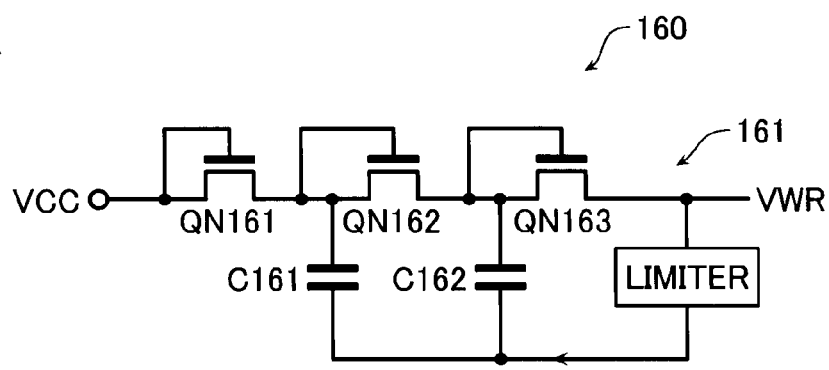
FIG. 15 is a circuit diagram of a write voltage generator and a non-selected word-line voltage generator in the nonvolatile memory according to the same embodiment.
Figure 15:
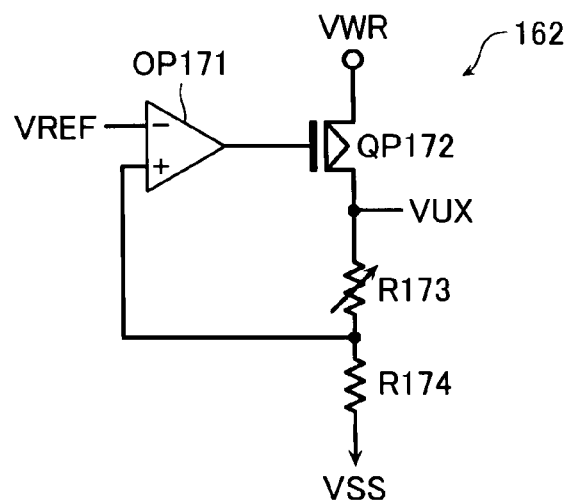

FIG. 15 is a circuit diagram of part of a voltage generator 160, that is, a write voltage generator 161 and a non-selected word-line voltage generator 162.

The write voltage generator 161 is a circuit operative to boost the external power VCC of 2.7-3.3 V in normal times to generate a write voltage VWR of 4.0 V at the time of setting and of around 3.0 V at the time of resetting. The write voltage generator 161 is connected to the supply line of the external power VCC. It includes three NMOS transistors QN161-QN163 having current paths connected in series. These transistors QN161-QN163 are each diode-connected. The transistors QN161, QN162 and QN163 have respective drains, which are connected to capacitors C161, C162 and a limiter (LIMITER) at one end, respectively. The other ends of the capacitors C161, C162 and the limiter are connected in common. Such the configuration forms a charge pump, in which the drain of the transistor QN163 provides the output from this circuit, that is, the write voltage VWR.

The non-selected word-line voltage generator 162 is a circuit operative to drop the write voltage VWR generated at the write voltage generator 161 to generate the non-selected word-line voltage VUX. The non-selected word-line voltage generator 162 includes a PMOS transistor QP172, a variable resistor R173 and a fixed resistor R174, which are connected in series between the supply line of the write voltage VWR and the ground line. It also includes an opamp OP171 having a non-inverting input terminal supplied with the voltage on the connection node between resistors R173 and R174, and an inverting input terminal supplied with a certain reference voltage VREF for generating the non-selected word-line voltage VUX. The output signal from the opamp OP171 is fed to the gate of the transistor QP172. This configuration forms a constant-voltage circuit, in which the connection node between the opamp 172 and the resistor 173 provides the output from this circuit, that is, the non-selected word-line voltage VUX.

Referring next to FIGS. 16-19, the configuration of the column control circuit 2 is described in detail. FIGS. 16-19 are circuit diagrams showing a configurative example of the column control circuit 2 in the nonvolatile memory.

Figure 16:
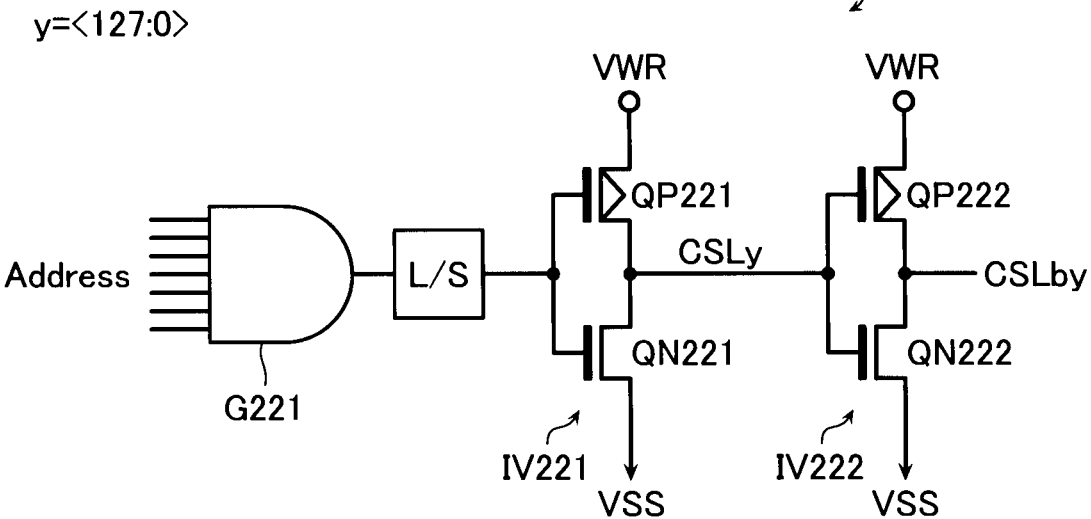
FIG. 16 is a circuit diagram of a column decoder in the nonvolatile memory according to the same embodiment.
Figure 18:
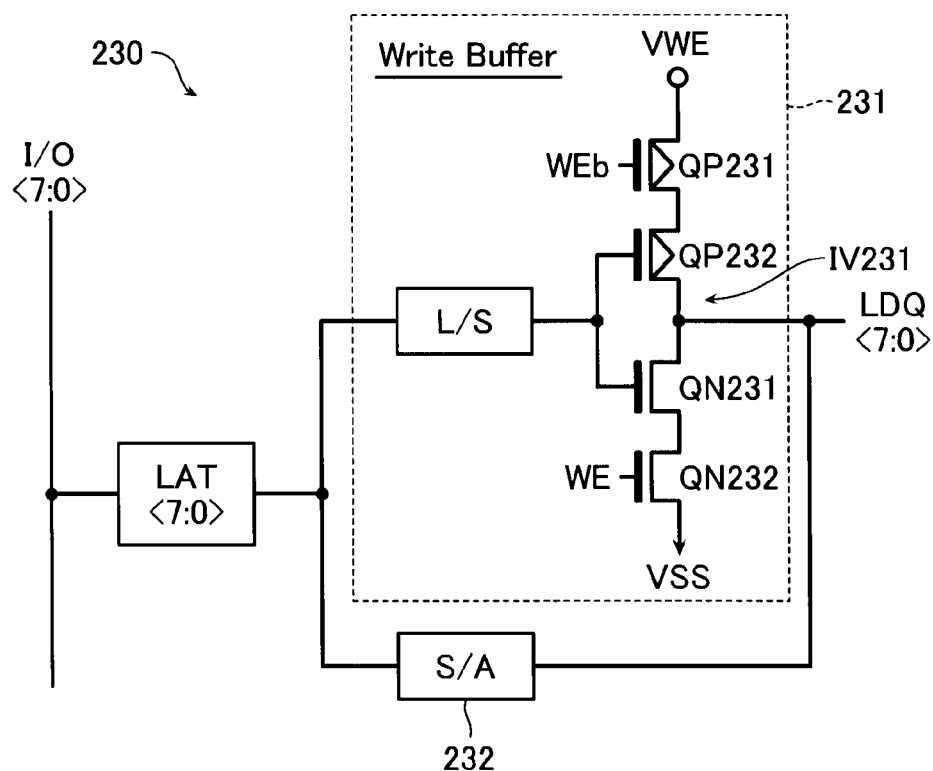
FIG. 18 is a circuit diagram of a sense amp/write buffer in the nonvolatile memory according to the same embodiment.

FIG. 16 is a circuit diagram of the column decoder 220. The column decoder 220 receives the column address and selects one of 128 pairs of column selection lines CSLy and CSLby (y=<128:0>). The column decoder 220 includes such the circuit as shown in FIG. 18 for each of the 128 pairs of column selection lines CSLy, CSLby. As shown in FIG. 16, the address signal lines connected to the column decoder 220 are connected to a logical gate G221. The output signal from the logical gate G221 is fed via a level shifter L/S to the input terminal of a CMOS inverter IV221 composed of a PMOS transistor QP221 and an NMOS transistor QN221. The transistor QP221 has a source connected to the supply line of the write voltage VWR, and the transistor QN221 has a source connected to the ground line. The drains of the transistors QP221 and QN221 are both connected to the column selection line CSLy. The column selection line CSLy is connected to a CMOS inverter IV222 composed of a PMOS transistor QP222 and an NMOS transistor QN222. The transistor QP222 has a source connected to the supply line of the write voltage VWR, and the transistor QN222 has a source connected to the ground line. The drains of the transistors QP222 and QN222 are both connected to the column selection line CSLby.

Figure 17:
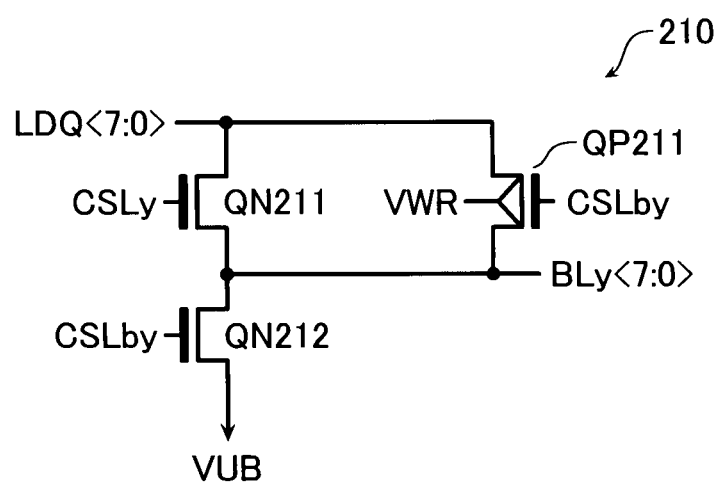
FIG. 17 is a circuit diagram of a column driver in the nonvolatile memory according to the same embodiment.

FIG. 17 is a circuit diagram of the column driver 210. The column driver 210 is connected to any one of 128 pairs of column selection lines CSLy and CSLby (y=<128:0>), the supply line of the non-selected bit-line voltage VUB and the local data line LDQ<7:0>. The column driver 210 is connected to the bit line BLy<7:0>. This bit line is connected to plural memory cells MC arranged in line. As described earlier, the bit lines BLy<7:0> connected to one column driver 210 are composed of 8 lines including the bit lines BLy<0>-BLy<7>. Similarly, the local data lines LDQ<7:0> are composed of 8 lines LDQ<0>-LDQ<7>. As shown in FIG. 16, the column driver 210 includes 8 transistor pairs of two NMOS transistors QN211 and QN212 having mutually connected sources, and a PMOS transistor QP211 having a source and a drain connected to the source and the drain of the transistor QN211. The transistors QN211, QP211 have respective gates connected to the column selection lines CSLy, CSLby and a drain connected to any one of the local data lines LDQ<7:0>. The transistor QN212 has a gate connected to the column selection line CSLby and a drain connected to the supply line of the non-selected bit-line voltage VUB. The sources of the transistors QN211, QN212 and QP211 are connected in common to any one of the bit lines BLy<7:0>.

FIG. 18 is a circuit diagram of a part of the sense amp/write buffer 230. The sense amp/write buffer 230 is connected to the supply line of the write power VWR, the local data line LDQ<7:0>, and the data input/output line I/O<7:0>. First, the write buffer (Write Buffer) 231 is described on the configuration thereof. The data input/output line I/O<7:0> connected to the sense amp/write buffer 230 is connected via a latch circuit LAT and a level shifter L/S to a CMOS inverter IV231 composed of a PMOS transistor QP232 and an NMOS transistor QN231. The transistor QP232 has a source connected to the supply line of the column voltage VWE via a write-buffer partly-activating PMOS transistor QP231. The column voltage VWE is a voltage derived from the current-limited write voltage VWR and supplied from the later-described bit-line current limit circuit. The transistor QN231 has a source connected to the ground line via a write-buffer partly-activating NMOS transistor QN232. The drains of the transistors QP232 and QN231 are both connected to the local data line LDQ<7:0>.

Next, a sense amp 232 is described on the configuration thereof. The data input/output line I/O<7:0> connected to the sense amp/write buffer 230 is connected to the sense amp 232. Available examples of the sense amp 232 include various types such as the single-ended type and the differential type that uses a reference cell. The output terminal of the sense amp 232 is connected to the local data line LDQ<7:0>.

Figure 19:
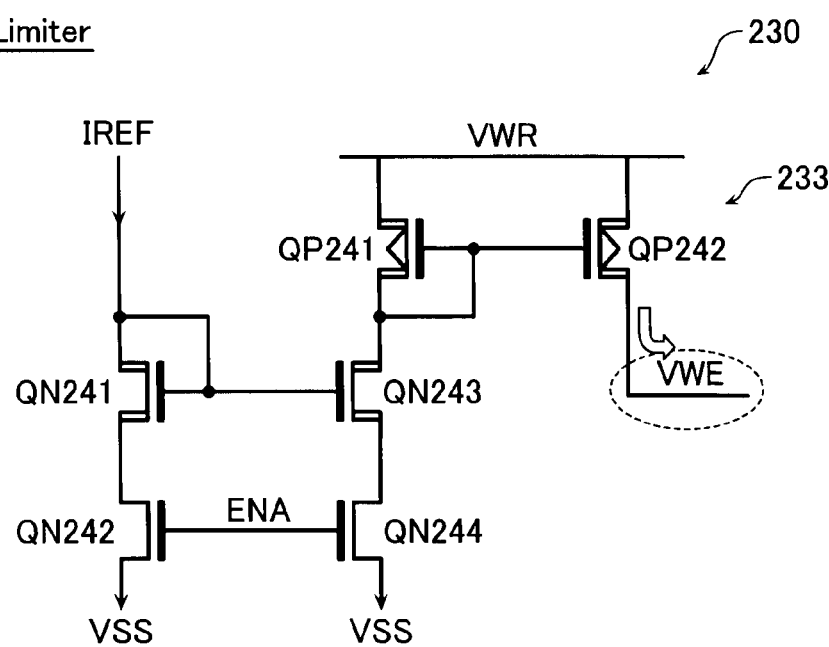
FIG. 19 is a circuit diagram of a bit-line current limit circuit in the nonvolatile memory according to the same embodiment.

FIG. 19 is a circuit diagram of another part of the sense amp/write buffer 230, which includes a second current limit circuit, that is, a bit-line current limit circuit 233. The bit-line current limit circuit 233 is a circuit operative to provide the column voltage VWE to the write buffer 231. The current limit circuit 233 includes high-voltage NMOS transistors QN241, QN243 that form a first current mirror circuit operative to receive the flow of reference current IREF supplied from a constant-current source, not shown; NMOS transistors QN242 (fifth switch circuit), QN244 (sixth switch circuit) operative to activate the above mirror transistors; and high-voltage PMOS transistors QP241, QP242 that form a second current mirror circuit operative to receive the current flowing in the transistor QN243.

Figure 20:
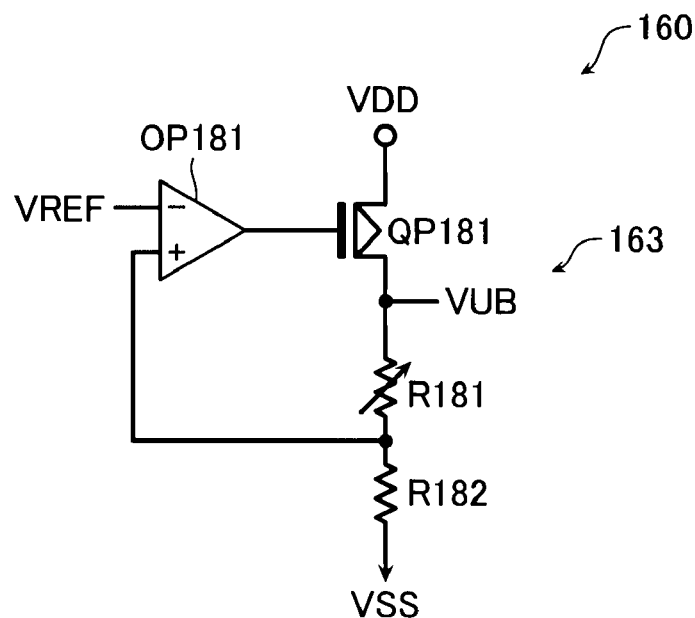
FIG. 20 is a circuit diagram of a non-selected bit-line voltage generator in the nonvolatile memory according to the same embodiment.

FIG. 20 is a circuit diagram of a non-selected bit-line voltage generator 163 contained in the voltage generator 160. The non-selected bit-line voltage generator 163 includes a PMOS transistor QP181, a variable resistor R181 and a fixed resistor R182, which are connected in series between the supply line of the supply power VDD and the ground line. It also includes an opamp OP181 having a non-inverting input terminal supplied with the voltage on the connection node between the resistors R181 and R182, and an inverting input terminal supplied with a certain reference voltage VREF for generating the non-selected bit-line voltage VUB. The output from the opamp OP181 is fed to the gate of the transistor QP181. This configuration forms a constant-voltage circuit, in which the connection node between the transistor QP181 and the resistor R181 provides the output from this circuit, that is, the non-selected bit-line voltage VUB.

The following description is given to setting in the non-volatile memory thus configured. First, operation of the row-system control circuit in the nonvolatile memory at the time of setting is described with reference to FIGS. 10-14.

First, operation of the main row decoder 130 is described.

The input terminal of the logical gate G131 in the main row decoder 130 is supplied with the address signal (Address) as well. In accordance with this address signal, the logical gate G131 provides the input terminal of the inverter IV131 with "L" for the selected x (for example, x=0) and "H" for the non-selected x, of x=<255:0>. In the case of the selected x (for example, x=0), the input terminal of the inverter IV131 is supplied with "L" to feed the write voltage VWR ("H") through the turned-on transistor QP131 to the main word line MWL<0>. The "H" on the main word line MWL<0> is fed to the input terminal of the inverter IV132 to feed the ground voltage VSS ("L") through the turned-on transistor QN132 to the main word line MWLb<0>. Namely, in the case of the selected x (for example, x=0), the main word line MWL<0> is supplied with "H" and the main word line MWLb<0> with "L". In the case of the non-selected x, the input terminal of the inverter IV131 is supplied with "H" to feed the ground voltage VSS ("L") through the turned-on transistor QN131 to the main word line MWLx. The "L" on the main word line MWLx is fed to the input terminal of the inverter IV132 to feed the write voltage VWR of "H" through the turned-on transistor QP132 to the main word line MWLbx. Namely, in the case of the non-selected x, the main word line MWLx is supplied with "L" and the main word line MWLbx with "H".

Subsequently, operation of the write-drive-line driver 140 is described.

The input terminal of the logical gate GG141 in the write-drive-line driver 140 is supplied with the address signal (Address). In accordance with this address signal, the logical gate G141 provides the input terminal of the inverter IV141 with "H" for one write drive line (for example, WDRV<i>) corresponding to the address signal and "L" for other write drive lines WDRV not corresponding to. In the case of the write drive line (for example, WDRV<i>) corresponding to the address signal, the input terminal of the inverter IV141 is supplied with "H", which turns the output from the inverter IV141 to the row ground voltage VSSROW. In the case of the write drive line WDRV not corresponding to the address signal, the input terminal of the inverter IV141 is supplied with "L", which turns the output from the inverter IV141 to the non-selected word-line voltage VUX. This is applied to the write drive line WDRV<i> in the row driver 120.

Subsequently, operation of the row driver 120 is described.

In accordance with the signals supplied to the main word lines MWLx and MWLbx, the row driver 120 applies the non-selected word-line voltage VUX or the voltage on the write drive line WDRV to the word line WL. In the case of the selected x (for example, x=0), the main word lines MWL0 is supplied with "H" and the main word lines MWLb0 with "L". Thus, the gates of the transistors QN121, QP122 in the row driver 120 are supplied with "H" and the gate of the transistor QP121 with "L" to apply the voltage on the write drive line WDRV<7:0> through the turned-on transistors QN121, QN122 to WL0<7:0>. In this case, the write drive line (for example, WDRV<1>) corresponding to the address signal is supplied with the ground voltage VSS and the write drive lines not corresponding to the address signal are supplied with the non-selected word-line voltage VUX. Of the word lines WL0<7:0>, only one word line WL0<1> selected with the address signal is supplied with the ground voltage VSS and other word lines WL are supplied with the non-selected word-line voltage VUX. In the case of the non-selected x, the main word line MWLx is supplied with "L" and the main word line MWLbx with "H". Thus, in the row driver 120 the gate of the transistor QP121 is supplied with "H" and the gates of the transistors QN121, QP122 are supplied with "L" to apply the non-selected word-line voltage VUX through the turned-on transistor QP122 to the word line WLx<7:0>. As a result, only one word line WL0<1> selected with the address signal is supplied with the ground voltage VSS and all other word lines WL are supplied with the non-selected word-line voltage VUX at the time of setting.

Finally, operation of the word-line current limit circuit 141 is described.

If the current in the word line WL is not limited, the switch signals SW1, SW2 are turned to "H", "L", respectively, in the word-line current limit circuit 141. In this case, the transistor QN151 is turned on and accordingly the row ground voltage VSSROW is directly connected to the ground voltage VSS for strong drive. On the other hand, if the current in the word line WL is limited, the switch signals SW1, SW2 are turned to "L", "H", respectively. In this case, the transistor QN152 is turned on and accordingly the transistor QN153 controlled by the certain reference voltage IREF limits the current.

Next, operation of the column-system control circuit in the nonvolatile memory at the time of setting is described with reference to FIGS. 16-19.

First, operation of the sense amp/write buffer 230 is described.

At the time of setting, write enable signals WE, WEb are applied to activate the inverter IV231 in the write buffer 231. As a result, the data on the data input/output line I/O<7:0> is taken into the inverter IV231 via the latch circuit LAT and the level shifter L/S. The inverter IV231 provides the local data line LDQ<7:0> with the column voltage VWE or the ground voltage VSS in accordance with this data.

Subsequently, operation of the bit-line current limit circuit 233 is described.

The bit-line current limit circuit 233 is activated when the enable signal ENA turns "H" such that the write voltage VWR based on the set voltage VSET or the reset voltage VRESET is provided as the column voltage VWE. At this time, the current value is determined by the reference current IREF flowing in the transistor QN241, the mirror ratio between the transistors QN241 and QN242, and the mirror ratio between the transistors QP241 and QP242. Therefore, the value of current flowing in the selected memory cell MC can be limited to prevent failed write from occurring.

Subsequently, operation of the column decoder 220 is described.

The column decoder 220 selects one column selection line CSLy, CSLby (for example, y=0) based on the address signal (Address) fed to the logical gate G221. The inverter IV221 corresponding to the selected column selection line CSL0 is supplied with "L" and other inverters IV221 are supplied with "H". As a result, the selected column selection lines CSL0, CSLb0 are turned to "H" (the write voltage VWR), "L" (the ground voltage VSS) while the non-selected column selection lines CSLy, CSLy are turned to "L" (the ground voltage VSS), "H" (the write voltage VWR), respectively.

Subsequently, operation of the column driver 210 is described.

The column driver 210 applies the non-selected bit-line voltage VUB or the voltage on the local data line LDQ to the bit line BL based on the signals on the column selection lines CSLy, CSLby received from the column decoder 220. If the column selection lines CSLy, CSLby are "H", "L", then the transistors QN211, QP211 turn on and the transistor QN212 turns off. Accordingly, the bit line BLy<7:0> is supplied with the voltage on the local data line LDQ<7:0> via the transistors QN211, QP211. At this time, only the local data line LDQ<i> selected by the address signal is supplied with the write voltage VWR. Therefore, the write voltage VWR can be supplied only to the bit line BLy<i>. On the other hand, if the column selection lines CSLy, CSLby are "L", "H", then the transistors QN211, QP211 turn off and the transistor QN212 turns on. Therefore, the bit line BLy<7:0> is supplied with the non-selected bit-line voltage VUB via the transistor QN212. Thus, at the time of setting, only one bit line BLy<i> selected by the address signal is supplied with the write voltage VWR and all other bit lines BLy are supplied with the non-selected bit-line voltage VUB.

As above, in the nonvolatile memory according to the present embodiment, the bit-line current limit circuit 233 limits the current flowing in the bit line BL. Furthermore, the word-line current limit circuit 141 boosts the voltage on the word line WL after the selected memory cell MC makes a transition to the set state, thereby making the current hard to flow in the selected memory cell MC.

In a word, the present embodiment makes it possible to limit the current not only in the bit line BL but also in the word line WL, thereby achieving a higher current limiting effect on the memory cell MC. As a result, the voltage drop across the variable resistance element VR can be reduced, thereby reducing the possibility of causing failed write after setting. In addition, the reduction of current consumption at each memory cell MC can increase the number of memory cells MC selectable at the same time, which leads to an improvement in the performance of the nonvolatile memory.

Second Embodiment

A nonvolatile memory according to a second embodiment is same as the nonvolatile memory according to the first embodiment except for a charge limit circuit 234 provided in place of the bit-line current limit circuit 233 shown in FIG. 19.

Figure 21:
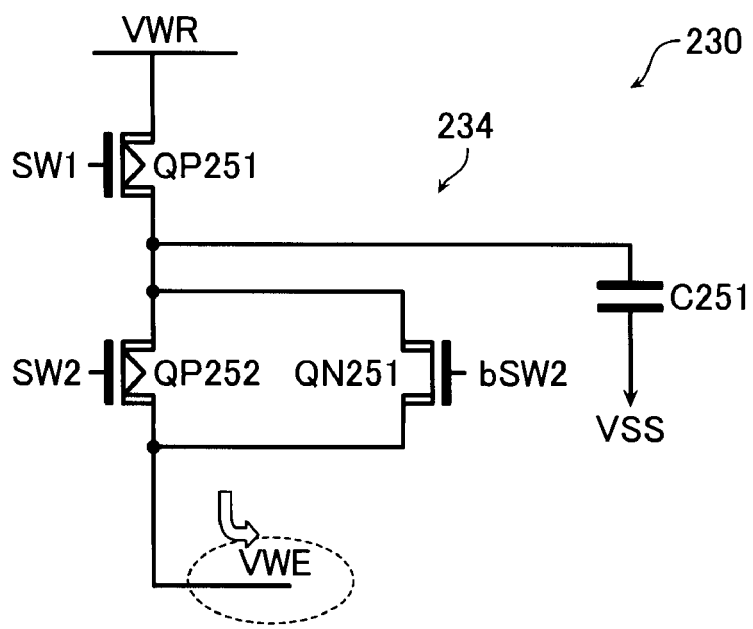
FIG. 21 is a circuit diagram of a charge limit circuit in a nonvolatile memory according to a second embodiment.

FIG. 21 is a circuit diagram of the charge limit circuit 234 according to the present embodiment. The charge limit circuit 234 is operative to provide the selected memory cell MC with a necessary and sufficient amount of charge for setting the selected memory cell MC.

The charge limit circuit 234 includes serially-connected high-voltage PMOS transistors QP251, QP252, and a high-voltage NMOS transistor QN251 connected in parallel with the transistor QP252. The charge limit circuit 234 also includes a capacitor C251 connected to the connection node between the transistors QP251, QP252 to receive charge from the supply line of the write voltage VWR (second voltage) via the transistor QP251. The transistor QP251 forms a third switch circuit, and the transistors QP252 and QN251 form a fourth switch circuit.

In the charge limit circuit 234, first, prior to setting, the first control signal, that is, the switch signal SW1 becomes "L" to turn on the transistor QP251, thereby pre-charging the capacitor C251 from the write voltage VWR with charge necessary for setting. Next, the switch signal SW1 becomes "H" to turn off the transistor QP252. In addition, the second control signal, that is, the switch signal SW2 becomes "L" and the signal of the reverse logic to the switch signal SW2, that is, the switch signal bSW2 becomes "H" to open the transfer gate composed of the transistors QP251, QN251, thereby bringing the bit line BL in the floating state. Therefore, charge is supplied to the selected memory cell within the charge on the capacitor C251 and accordingly the value of current flowing in the selected memory cell can be limited.

Even if the charge limit circuit 234 operative to float the bit line BL to limit the current is used as in the present embodiment, the use of the word-line current limit circuit 140 shown in FIG. 14 makes it possible to enhance the current limiting effect. As a result, similar to the first embodiment, the voltage drop across the variable resistance element VR can be reduced, thereby reducing the possibility of causing failed write after setting. In addition, the reduction of current consumption at each memory cell MC can increase the number of memory cells MC selectable at the same time, which leads to an improvement in the performance of the nonvolatile memory.

OTHERS

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array including plural mutually crossing first and second lines and memory cells arranged at intersections of said first and second lines, each memory cell containing a variable resistance element and a rectifier element connected in series; and
   a data write/erase circuit operative to apply a voltage required for data write/erase to said memory cell via said first and second lines,
   wherein said data write/erase circuit includes a first current limit circuit operative to limit the current flowing in a cathode-side line provided on a cathode side of said rectifier element, of said first and second lines, when an anode-side line provided on an anode side of said rectifier element, of said first and second lines, is applied with a voltage higher than a voltage applied to the cathode-side line; and
   a charge limit circuit operative to limit the amount of charge supplied to said memory cell at the time of data write/erase, said charge limit circuit including a capacitor operative to accumulate the certain amount of charge in accordance with a first control signal and discharge the accumulated charge to said memory cell in accordance with a second control signal.

2. The nonvolatile semiconductor memory device according to claim 1, wherein said data write/erase circuit includes a driver circuit operative to provide said cathode-side line with a voltage required for said data write/erase supplied from said first current limit circuit,
   wherein said first current limit circuit includes a current limiting transistor to supply a certain first voltage via said current limiting transistor to said data write/erase circuit as said voltage required for said data write/erase.

3. The nonvolatile semiconductor memory device according to claim 2, wherein said first current limit circuit includes
   a first switch circuit arranged to directly connect between the terminal of said first voltage and said driver circuit, and
   a second switch circuit arranged to connect between the terminal of said first voltage and said driver circuit via said current limiting transistor.

4. The nonvolatile semiconductor memory device according to claim 1, wherein said charge limit circuit includes
   a third switch circuit arranged controllable by said first control signal and operative to connect between said capacitor and a certain second voltage, and
   a fourth switch circuit arranged controllable by said second control signal and operative to connect between said capacitor and the charge supply path to said memory cell.

5. The nonvolatile semiconductor memory device according to claim 4, wherein said charge limit circuit turns on said third switch circuit and turns off said fourth switch circuit before data write/erase,
   wherein said charge limit circuit turns off said third switch circuit and turns on said fourth switch circuit at the time of data write/erase.

6. A nonvolatile semiconductor memory device, comprising:
   a memory cell array including plural mutually crossing first and second lines and memory cells arranged at intersections of said first and second lines, each memory cell containing a variable resistance element; and
   a data write/erase circuit operative to apply a voltage required for data write/erase to said memory cell via said first and second lines,
   wherein said data write/erase circuit includes a first current limit circuit and a second current limit circuit,
   the first current limit circuit operative to limit current flowing in a cathode-side line provided on the cathode side of said rectifier element, at a time of data write/erase,
   the second current limit circuit operative to limit current flowing in an anode-side line provided on an anode side of said rectifier element, of said first and second lines, when the anode-side line is applied with a voltage higher than a voltage applied to the cathode-side line, and
   said second current limit circuit including:
   a constant-current circuit operative to supply a flow of certain reference current;
   a first current mirror circuit having an input to receive said constant-current circuit; and
   a second current mirror circuit having an input to receive the output from said first current mirror circuit and drivable with said voltage required for said data write/erase.

7. The nonvolatile semiconductor memory device according to claim 6, wherein said data write/erase circuit includes a driver circuit operative to provide said cathode-side line with a voltage required for said data write/erase supplied from said first current limit circuit, at the time of data write/erase,
   wherein said first current limit circuit includes a current limiting transistor to supply a certain first voltage via said current limiting transistor to said data write/erase circuit as said voltage required for said data write/erase.

8. The nonvolatile semiconductor memory device according to claim 7, wherein said first current limit circuit includes
   a first switch circuit arranged to directly connect between the terminal of said first voltage and said driver circuit, and
   a second switch circuit arranged to connect between the terminal of said first voltage and said driver circuit via said current limiting transistor.

9. The nonvolatile semiconductor memory device according to claim 6, wherein said second current limit circuit includes
   a fifth switch circuit arranged on a current path at the input-side of said first current mirror circuit, and
   a sixth switch circuit arranged on a current path at the output-side of said first current mirror circuit, wherein said second current limit circuit is activated when said fifth and sixth switch circuits are turned on, and inactivated when said fifth and sixth switch circuits are turned off.

10. The nonvolatile semiconductor memory device according to claim 9, wherein said first and second current mirror circuits in said second current limit circuit include high-voltage transistors.

11. A nonvolatile semiconductor memory device, comprising:
a memory cell array including plural mutually crossing first and second lines and memory cells arranged at intersections of said first and second lines, each memory cell containing a variable resistance element and a rectifier element connected in series; and
a data write/erase circuit operative to apply a voltage required for data write/erase to said memory cell via said first and second lines,
wherein said data write/erase circuit includes a first current limit circuit and a charge limit circuit,
the first current limit circuit operative to limit current flowing in a cathode-side line provided on a cathode side of said rectifier element, of said first and second lines,
the charge limit circuit operative to float the anode-side line provided on an anode side of said rectifier element, of said first and second lines, when an anode-side line is applied with a voltage higher than a voltage applied to the cathode-side line, and
said charge limit circuit including a capacitor operative to accumulate the certain amount of charge in accordance with a first control signal discharge the accumulated charge to said memory cell in accordance with a second control signal.

12. The nonvolatile semiconductor memory device according to claim 11, wherein said data write/erase circuit includes a driver circuit operative to provide said cathode-side line with a voltage required for said data write/erase supplied from said first current limit circuit, at the time of data write/erase,
wherein said first current limit circuit includes a current limiting transistor to supply a certain first voltage via said current limiting transistor to said data write/erase circuit as said voltage required for said data write/erase.

13. The nonvolatile semiconductor memory device according to claim 12, wherein said first current limit circuit includes
a first switch circuit arranged to directly connect between the terminal of said first voltage and said driver circuit, and
a second switch circuit arranged to connect between the terminal of said first voltage and said driver circuit via said current limiting transistor.

14. The nonvolatile semiconductor memory device according to claim 11, wherein said charge limit circuit includes
a third switch circuit arranged controllable by said first control signal and operative to connect between said capacitor and a certain second voltage, and
a fourth switch circuit arranged controllable by said second control signal and operative to connect between said capacitor and the charge supply path to said memory cell.

15. The nonvolatile semiconductor memory device according to claim 14, wherein said charge limit circuit turns on said third switch circuit and turns off said fourth switch circuit before data write/erase,
wherein said charge limit circuit turns off said third switch circuit and turns on said fourth switch circuit at the time of data write/erase.

16. The nonvolatile semiconductor memory device according to claim 15, wherein said third and fourth switch circuits include high-voltage transistors.

* * * * *